(12) United States Patent
Chen et al.

(10) Patent No.: US 7,675,186 B2
(45) Date of Patent: Mar. 9, 2010

(54) IC PACKAGE WITH A PROTECTIVE ENCAPSULANT AND A STIFFENING ENCAPSULANT

(75) Inventors: Cheng-Ping Chen, Hsinchu (TW); Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 683 days.

(21) Appl. No.: 11/514,349

(22) Filed: Sep. 1, 2006

(65) Prior Publication Data

US 2008/0054494 A1   Mar. 6, 2008

(51) Int. Cl.
 *H01L 23/29* (2006.01)
(52) U.S. Cl. .......... 257/790; 438/126; 438/127; 257/E23.127; 257/E23.131
(58) Field of Classification Search ......... 257/789, 257/790
See application file for complete search history.

(56) References Cited

U.S. PATENT DOCUMENTS

| | | | | |
|---|---|---|---|---|
| 5,641,997 | A * | 6/1997 | Ohta et al. | 257/788 |
| 6,201,299 | B1 * | 3/2001 | Tao et al. | 257/701 |
| 6,376,916 | B1 * | 4/2002 | Hosono et al. | 257/778 |
| 6,617,701 | B2 * | 9/2003 | Tanaka et al. | 257/789 |
| 2002/0033378 | A1 * | 3/2002 | Hayashi et al. | 216/11 |
| 2004/0038457 | A1 * | 2/2004 | Thurgood | 438/127 |
| 2004/0183193 | A1 * | 9/2004 | Koide et al. | 257/734 |

* cited by examiner

*Primary Examiner*—Wai-Sing Louie
*Assistant Examiner*—Abul Kalam (57) ABSTRACT

An IC package mainly includes a substrate having slot(s), a chip, a protective encapsulant, a stiffening encapsulant, and a plurality of external terminals. The Young's modulus of the stiffening encapsulant is greater than the one of the protective encapsulant and the curing shrinkage of the stiffening encapsulant is smaller than the one of the protective encapsulant. The protective encapsulant is formed on one of the surfaces of the substrate for encapsulating the chip. The stiffening encapsulant protrudes from the other surface of the substrate where the external terminals are disposed. Moreover, the stiffening encapsulant is formed inside the slot and is contacted with the chip. Since the stiffening encapsulant is embedded and formed inside the slot, therefore, the contact area of the stiffening encapsulant with the substrate is increased to enhance the warpage resistance of the IC package.

7 Claims, 9 Drawing Sheets

IC PACKAGE WITH A PROTECTIVE ENCAPSULANT AND A STIFFENING ENCAPSULANT

FIELD OF THE INVENTION

The present invention relates to an IC package, and more particularly to a window BGA (Ball Grid Array) package with the enhancement of warpage resistance.

BACKGROUND OF THE INVENTION

In all kinds of conventional IC packages, warpage is a serious problem existing at various interfaces during packaging processing or in packages.

Figure 1:
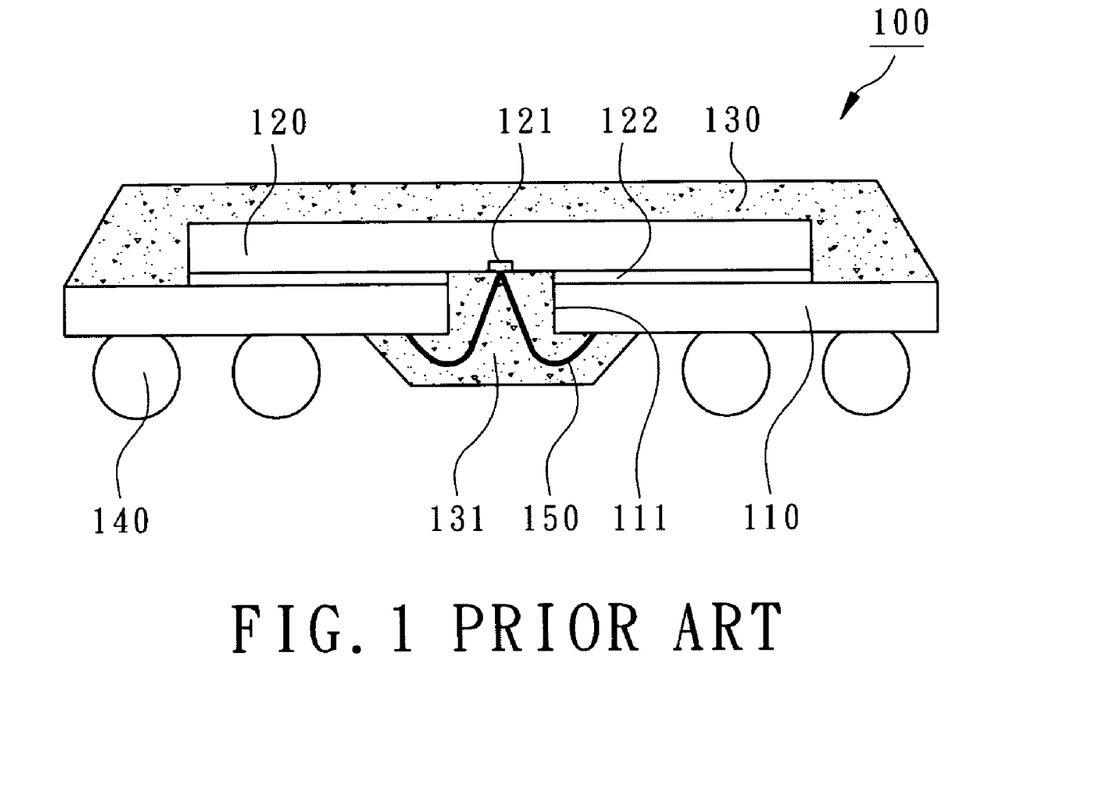
FIG. 1 shows a cross sectional view of a conventional IC package along the short central axis of its substrate.
Figure 2:
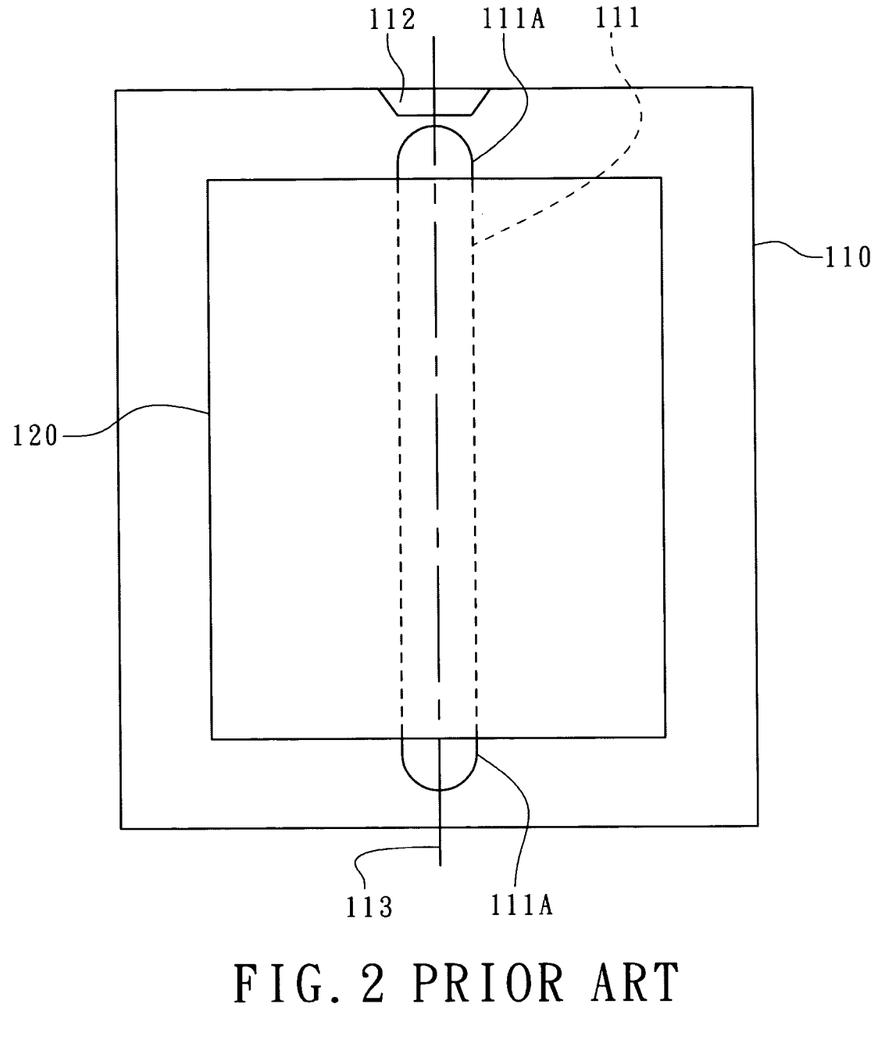
FIG. 2 shows a top view of the conventional IC package before encapsulation.
Figure 3:
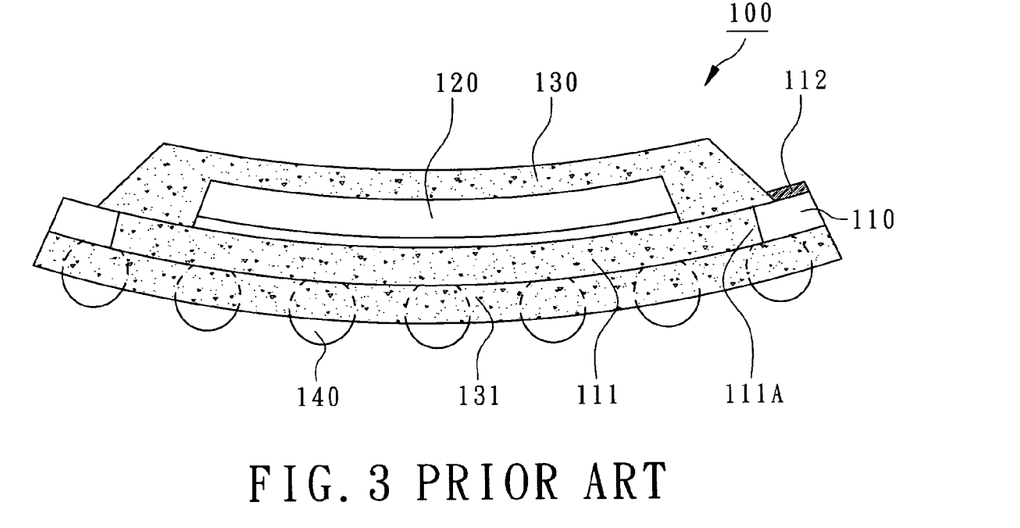
FIG. 3 shows a cross sectional view of the conventional IC package along the long central axis of its substrate.

As shown in FIG. 1, a window BGA 100 utilizes a substrate 110 having a slot 111 to carry a chip 120 by a die-attaching material 122. The bonding pads 121 of the chip 120 are electrically connected to the substrate 110 by a plurality of bonding wires 150. Then the chip 120 is encapsulated by an encapsulant 130. Moreover, a plurality of external terminals 140 such as solder balls are disposed under the substrate 110 for outer electrical connection. Since the slot 111 of the substrate 110 is formed and aligned to the center line 113 of the substrate 110 and is longer than the chip 120 for filling the slot 111 with the encapsulant 130. Since both extensions 111A of the slot 111 are not covered by the chip 120, therefore, the encapsulant 130 flowing from the top molding gate 112 will be formed on the top surface of the substrate 110 and also be formed in the slot 111 through the extensions 111A. As shown in FIG. 1, the encapsulant 131 at bottom encapsulates the bonding wires 150. However, the encapsulant 130 and its bottom part 131 are the same molding compound, therefore, there is no reinforcement effect. After molding, the encapsulant 130 is under curing shrinkage, therefore, there is warpage in the IC package 100, especially, at the cross section along the center line 113 as shown in FIG. 3.

A conventional IC package is disclosed to use two encapsulants with different materials to reduce the warpage due to temperature variations such as thermal cycle tests at the interfaces. Since the two different materials of the encapsulant are formed on the same substrate and are connected to each other, therefore, different molding processes and separated curing steps are needed. Therefore, the warpage due to the curing shrinkage of the encapsulant can not be avoided. Furthermore, since the first encapsulant is overlapped on the second encapsulant, the overall thickness of an IC package will increase.

Another known IC package is disclosed, where an internal encapsulant, a heat spreader, and an external encapsulant are formed on a substrate. The heat spreader covers the internal encapsulant and the external encapsulant formed around the heat spreader where the modulus of the external encapsulant is higher than the internal encapsulant. The heat spreader is a key component to completely cover the chip and to separate the internal encapsulant and the external encapsulant. The warpage still exists due to the curing shrinkage for both internal encapsulant and external encapsulant during molding process.

SUMMARY OF THE INVENTION

The main purpose of the present invention is to provide an IC package with a stiffening encapsulant which has a larger Young's modulus than the protective encapsulant, moreover, the curing shrinkage of the stiffening encapsulant is smaller than the one of the protecting encapuslant so that the warpage resistance of an IC package can be greatly enhanced. Furthermore, since the stiffening encapsulant is formed in a strip and connects with the chip and protrudes from the bottom surface of the substrate to achieve the warpage resistance of an IC package during encapsulation under a limited package thickness.

The second purpose of the present invention is to provide an IC package with the cross section of a stiffening encapsulant to enhance package strength.

The third purpose of the present invention is to provide an IC package with the length of the slot of the substrate to separate the stiffening encapsulant and the protective encapsulant so that both encapsulants with different materials can be molded and cured at the same time without mixing with each other.

The fourth purpose of the present invention is to provide an IC package with a chip dimension and a die attach material (DAM) to separate the stiffening encapsulant and the protective encapsulant so that both encapsulants with different materials can be molded and cured at the same time without mixing with each other.

The fifth purpose of the present invention is to provide an IC package with the design of the molding gate to enhance the formation of the stiffening encapsulant.

The sixth purpose of the present invention is to provide an IC package to prevent the breakage of the bonding wires during thermal cycle tests.

The seventh purpose of the present invention is to provide an IC package and an anti-warpage chip carrier to be implemented in window BGA packages and other flip chip IC packages.

According to the present invention, an IC package includes a substrate, a chip, a protective encapsulant, at least a stiffening encapsulant, and a plurality of external terminals, where the substrate has a top surface, a bottom surface, and at least a slot. The chip is disposed on the top surface of the substrate with the active surface of the chip partially exposed from the slot. The protective encapsulant is formed on the top surface of the substrate to at least encapsulate the sides of the chip. The stiffening encapsulant is in a strip and is formed inside the slot to contact with the exposed active surface of the chip and to protrude from the bottom surface of the substrate. The Young's modulus of the stiffening encapsulant is larger than the one of the protective encapsulant, moreover, the curing shrinkage of the stiffening encapsulant is smaller than the protective encapsulant to enhance the warpage resistance. Furthermore, another IC package with different package structures and the implementation of anti-warpage chip carriers are also revealed.

DETAIL DESCRIPTION OF THE INVENTION

Please refer to the attached drawings, the present invention will be described by means of embodiment(s) below.

Figure 4:
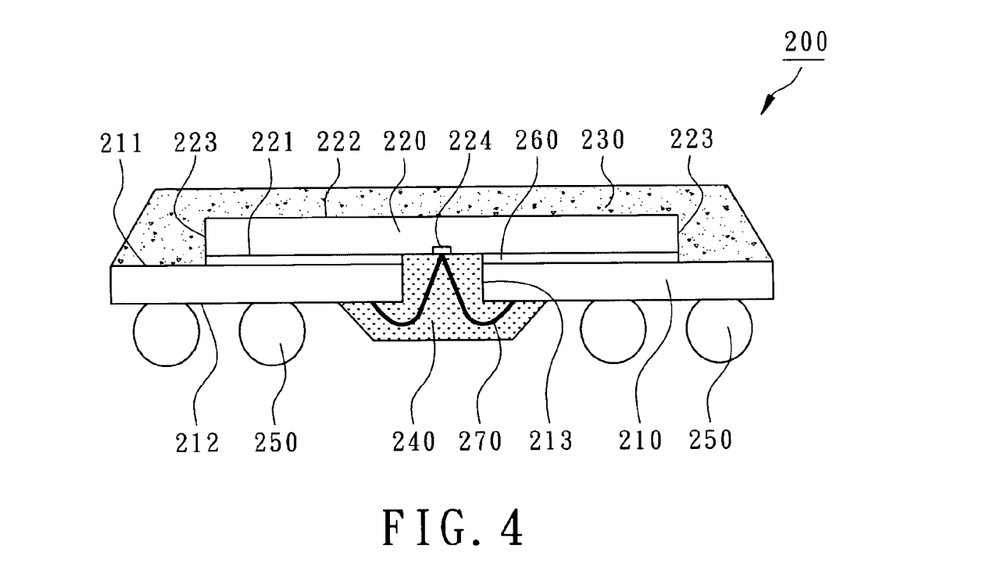
FIG. 4 shows a cross sectional view of an IC package along a short central line of its substrate according to the first embodiment of the present invention.
Figure 5:
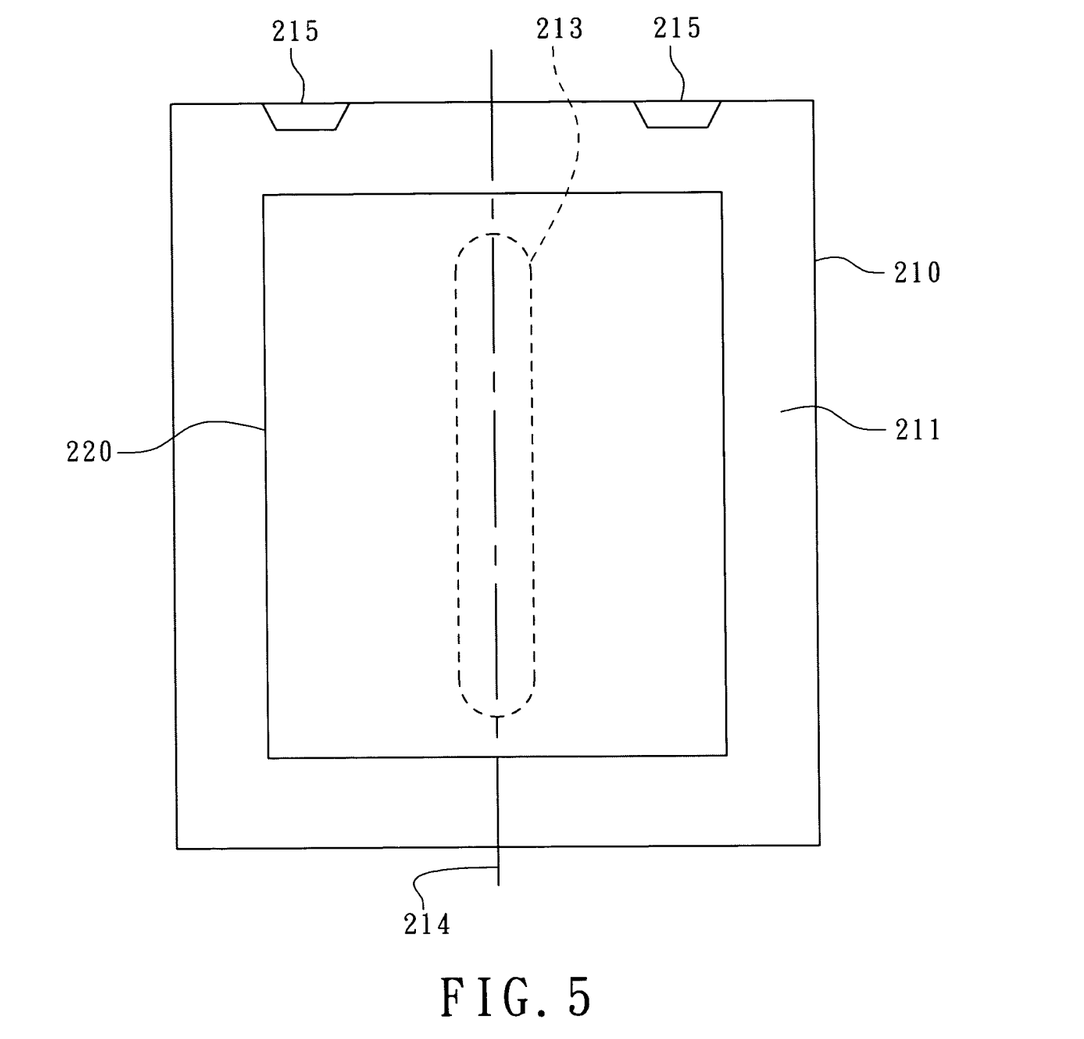
FIG. 5 shows a top view of the IC package before encapsulation according to the first embodiment of the present invention.
Figure 6:
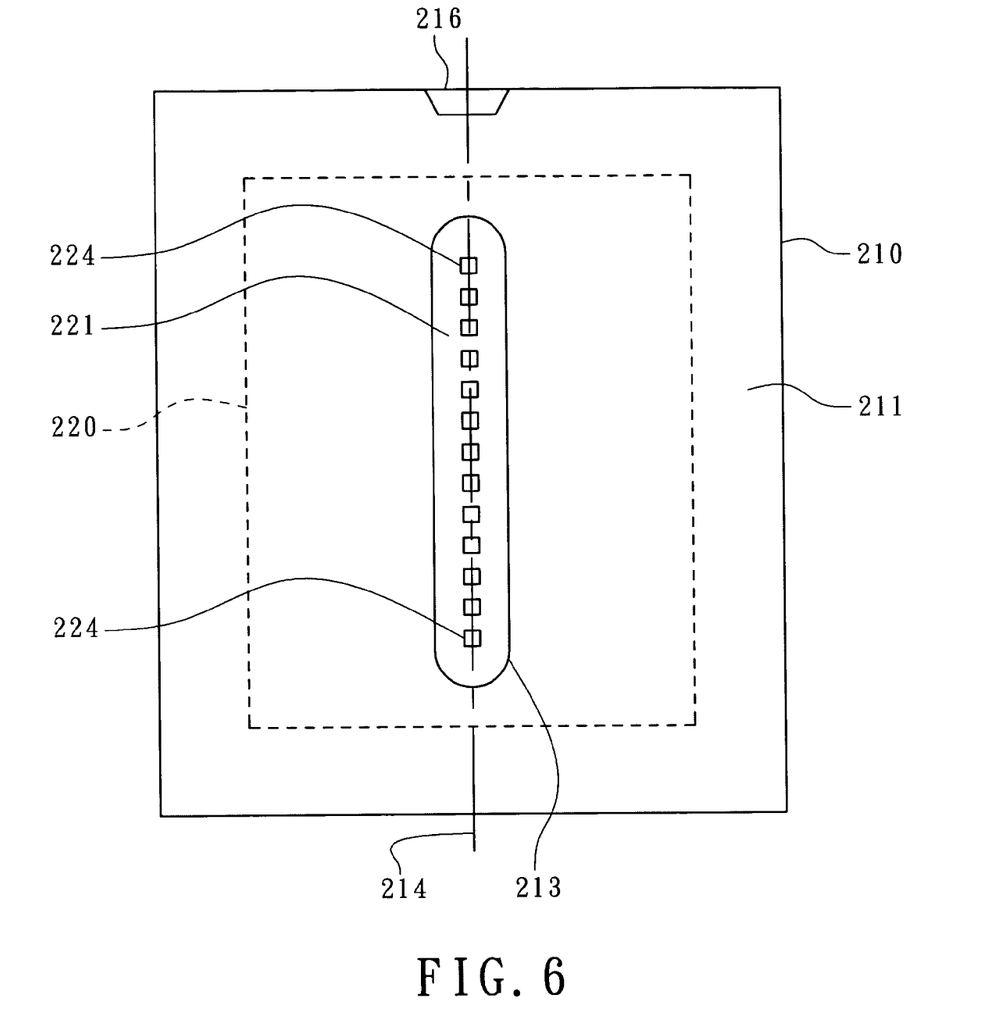
FIG. 6 shows a bottom view of the IC package before encapsulation according to the first embodiment of the present invention.
Figure 8:
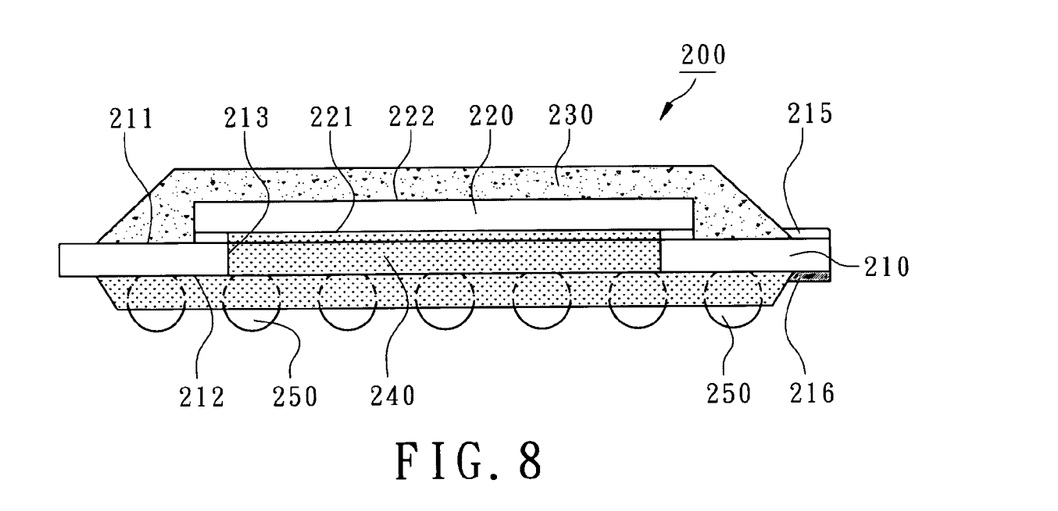
FIG. 8 shows a cross sectional view of the IC package along a long central axis of its substrate according to the first embodiment of the present invention.

FIG. 4 to FIG. 8 are shown to illustrate the first embodiment according to the present invention. As shown in FIG. 4 and FIG. 8, an IC package 200, which may be a window BGA, includes a substrate 210, a chip 220, a protective encapsulant 230, at least a stiffening encapsulant 240, and a plurality of external terminals 250. The substrate 210 is an IC carrier with patterned electrical circuits. Normally, the substrate 210 is a printed circuit board or a flexible electrical thin film. The substrate 210 has a top surface 211, a bottom surface 212, and at least a slot 213 where the top surface 211 is designed for die attachment and the bottom surface 212 is designed for external electrical mounting. The slot 213 is in a strip penetrating through the top surface 211 and the bottom surface 212. In the present embodiment, as shown in FIG. 5 and FIG. 6, the substrate 210 is approximately rectangular and has a defined long central axis 214. The slot 213 is aligned with the central line 214. Preferably, the slot 213 is shorter than the longer side of the chip 220 parallel to the long central axis 214 so that the chip 220 will completely cover the slot 213 when the chip 220 is disposed on the top surface 211 of the substrate 210 to avoid the mixing of the protective encapsulant 230 and the stiffening encapsulant 240. The implementation of this assembly is to increase the dimension of the chip 220 or to shrink the dimension of the substrate 210. In this embodiment, the active surface 221 of the chip 220 will cover more than 70% of the top surface 211 of the substrate 210 to ensure that the IC package 200 is a CSP (Chip Scale Package), and the slot 213 is completely covered by the chip 220.

Figure 7:
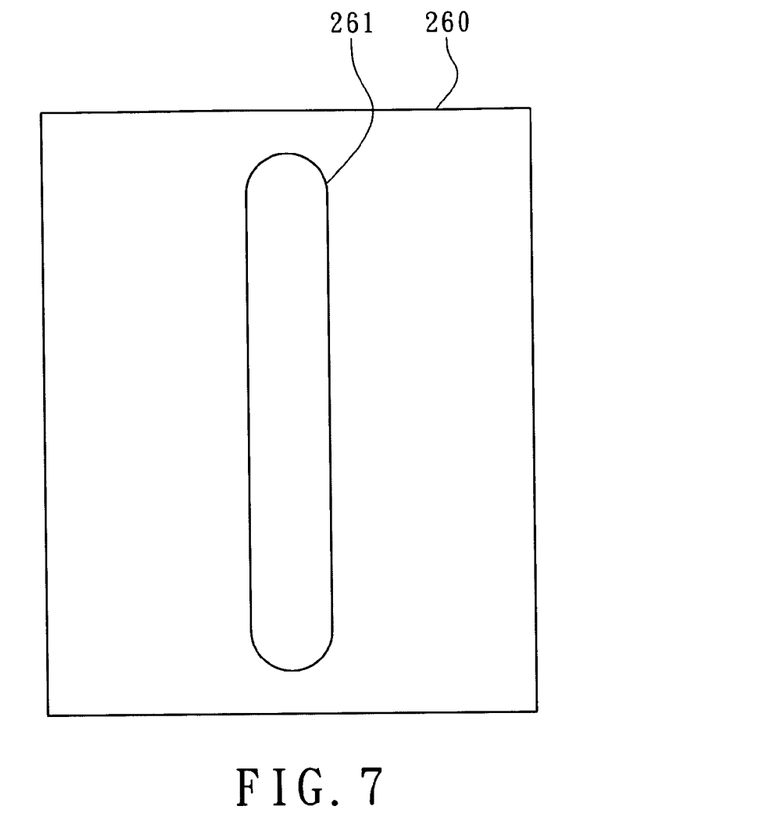
FIG. 7 shows the shape of a die attach material (DAM) of the IC package according to the first embodiment of the present invention.

As shown in FIGS. 4, 5, 6, and 8, the chip 220 has an active surface 221, a corresponding back surface 222, and a plurality of sides 223 between the active surface 221 and the back surface 222. The chip 220 is an IC component and has a plurality of bonding pads 224 formed on the active surface 221 as electrodes. The chip 220 is attached to the top surface 211 of the substrate 210 by a window-type die attach material 260 (as shown in FIG. 7), where the die attach material 260 may be a double-side adhesive tapes such as PI tapes or a printed B-stage film to attach the active surface 221 of the chip 220 to the top surface 211 of the substrate 210 and has an opening 261 aligned with the slot 213 so that the active surface 221 of the chip 220 is partially exposed from the slot 213 (as shown in FIG. 6). In the present embodiment, the bonding pads 224 are exposed from the slot 213, as shown in FIG. 6. By means of the window-type die attach material 260 and the chip 220, the protective encapsulant 230 and the stiffening encapsulant 240 are separated.

As shown in FIGS. 4 and 8, the protective encapsulant 230 is formed on the top surface 211 of the substrate 210 by molding and at least encapsulates the sides 223 of the chip 220. In the present embodiment, the protective encapsulant 230 even encapsulates the back surface 222 of the chip 220. As shown in FIG. 5, a plurality top molding gates 215 are formed on the top surface 211 of the substrate 210 for the injection of the protective encapsulant 230. However, the top molding gate 215 can also be formed outside the substrate 210.

As shown in FIGS. 4 and 8, the stiffening encapsulant 240 is in a strip. The stiffening encapsulant 240 has a filling portion formed inside the slot 213 and contacting with the partially exposed active surface 221 of the chip 220, also has a flange portion protruding from the bottom surface 212 of the substrate 210. Therefore, the thickness of the stiffening encapsulant 240 is from the active surface 221 of the chip 220 to the exposed external surface of the stiffening encapsulant 240. Moreover, the Young's modulus of the stiffening encapsulant 240 is greater than the one of the protective encapsulant 230 and the curing shrinkage of the stiffening encapsulant 240 is smaller than the one of the protective encapsulant 230 by using different thicknesses and materials. The stiffening encapsulant 240 will have a better warpage resistance. Comparing to the conventional fixing reinforcing component either metal or plastic, the thickness of the stiffening encapsulant 240 can be greater than the thickness of the substrate 210 under the limited total package height. Moreover, the contacting area between the stiffening encapsulant 240 and the substrate 210 is also larger, therefore, the warpage resistance of the substrate 210 has greatly enhanced, as shown in FIG. 8. Furthermore, the external terminals 250 are disposed on the bottom surface 212 of the substrate 210 where the external terminals 250 may be solder balls, solder paste, or other external electrical connecting components.

More detailedly, the Young's modulus of the stiffening encapsulant 240 ranges between 20 GPa and 50 GPa and the curing shrinkage of the stiffening encapsulant 240 ranges between 0.01% and 0.1%. On the contrary, the conventional molding compound of the conventional IC package and the protecting encapsulant 230 according to the present embodiment has a Young's modulus between 10 GPa and 25 GPa and a curing shrinkage between 0.1% and 0.2%. Accordingly, the stiffening encapsulant 240 is stiffer and lower shrinkage The Young's modulus is the ratio between positive stress and positive strain, where a corresponding positive strain will occur when a material is under positive stress. When under a constant positive stress, the larger the positive strain, the smaller the Young's modulus. For example, the Young's modulus of rubber is between 0.01 GPa and 0.1 GPa and the one of a diamond is greater than 1,000 GPa. Since the Young's modulus of the stiffening encapsulant 240 between 20 GPa and 50 GPa is greater than the ones of the conventional encapsulant or the protective encapsulant 230 between 10 GPa and 25 GPa. Moreover, the stiffening encapsulant 230 protrudes from the bottom surface 212 of the substrate 210 to present the effect of a rigid stiffener. To be more specific, the Young's modulus of the stiffening encapsulant 230 can be chosen between 25 GPa and 30 GPa which is very close the one of high strength concrete. This will greatly enhance the reliability of the IC package 200 during on board thermal cycle test.

To further explain the feasibility of the stiffening encapsulant 240 according to the present embodiment, the protective encapsulant 230 and the stiffening encapsulant 240 can be the Epoxy Molding Compound (EMC) with different receipts of silica contents which can be molding and curing at the same step to save the processing times. As shown in FIG. 6, a bottom molding gate 216 is formed on the bottom surface 212 of the substrate 210 for the injection of the stiffening encapsulant 240. The bottom molding gate 216 can be formed on the bottom surface 212 or outside the substrate 210. Preferably, the bottom molding gate 216 is not aligned with any of the top molding gate 215 to avoid mixing with each other. The top molding gates 215 are symmetrically disposed on both sides of the corresponding bottom molding gates 216. By using the variation of the numbers and the positions of the top molding gates 215 and the bottom molding gate 216, an equal molding speed of different EMC and quantities can be achieved. Moreover, there is no mixing or void issues while injecting the protective encapsulant 230 and the stiffening encapsulant 240 during the same molding process.

Preferably, as shown in FIG. 4, the IC package 200 further includes a plurality of bonding wires 270 which electrically connect the bonding pads 224 of the chip 220 to the connecting pads of the substrate 210 through the slot 213. The bonding wires 270 are encapsulated by the stiffening encapsulant 240 which can prevent wire-breakage during thermal cycle tests.

Preferably, as shown in FIG. 4, the stiffening encapsulant 240 has a cross section of a reverse "T" to further enhance the effect of warpage resistance.

Figure 9:
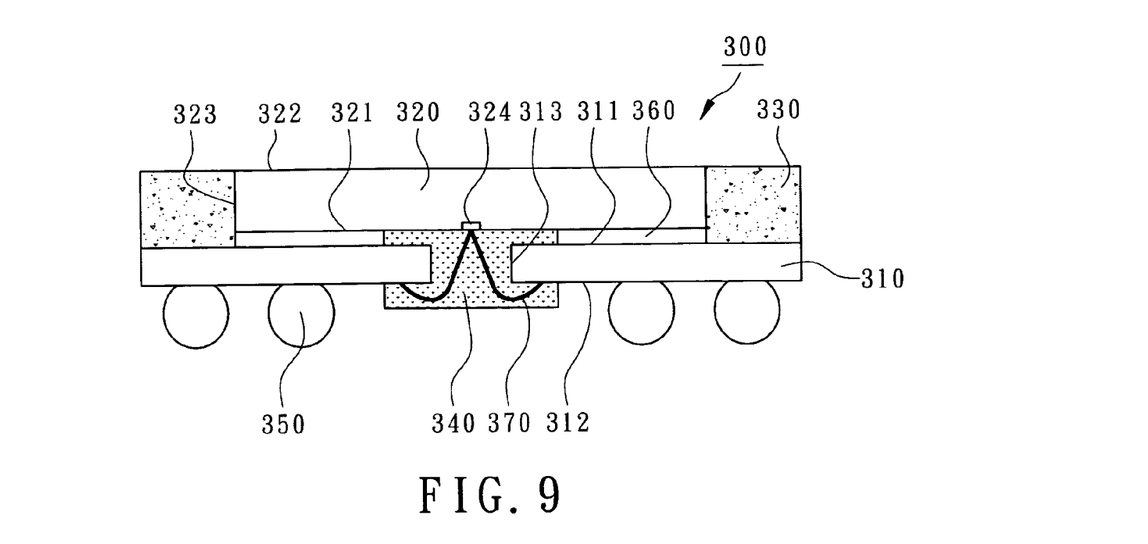
FIG. 9 shows a cross sectional view of an IC package along a short central axis of its substrate according to the second embodiment of the present invention.
Figure 10:
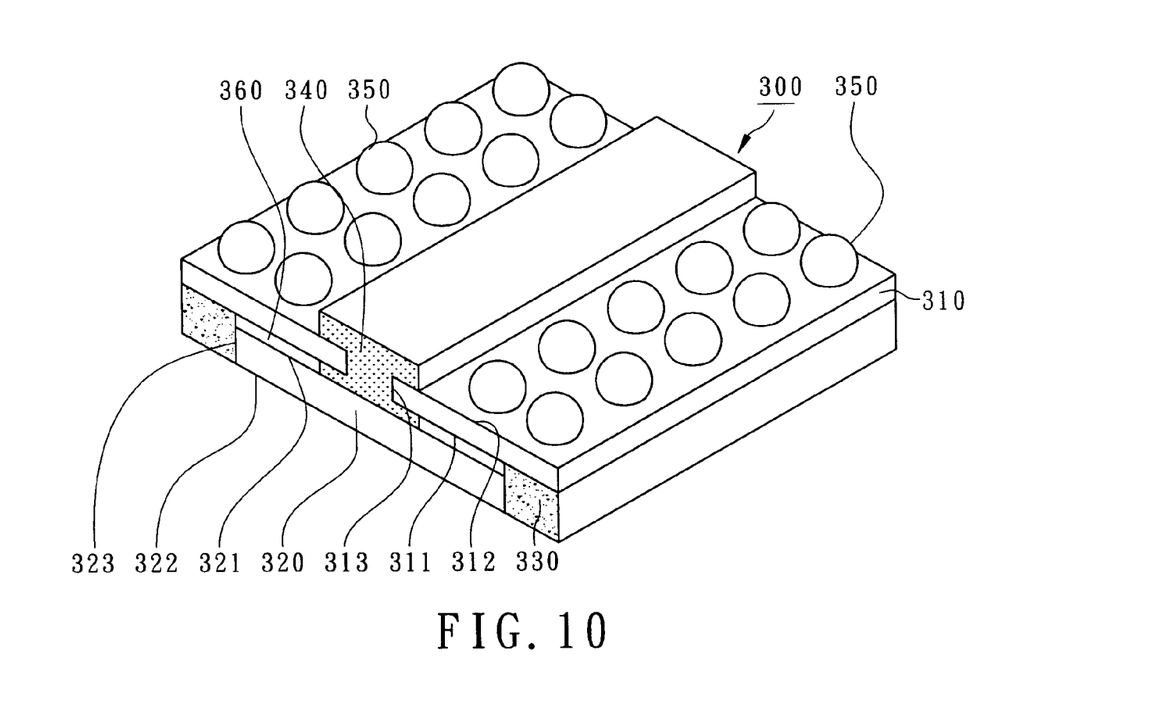
FIG. 10 shows a three-dimensional sectional view of the IC package according to the second embodiment of the present invention.

In the second embodiment of the present invention, another IC package is shown in FIGS. 9 and 10. The IC package 300 includes a substrate 310, a chip 320, a protective encapsulant 330, at least a stiffening encapsulant 340, and a plurality of external terminals 350. The stiffening encapsulant 340 has a cross section of "I" to enhance the warpage resistance. Furthermore, the substrate 310, the chip 320, the protective encapsulant 330, the external terminals 350 and the bonding wires 370 are the same as described in the first embodiment. The substrate 310 has a top surface 311, a bottom surface 312 and at least a slot 313 where the chip 320 is disposed on the top surface 311 of the substrate 310 by a window-type die attach material 360 so that the active surface 321 of the chip 320 is partially exposed from the slot 313. The bonding pads 324 of the chip 320 are electrically connected to the connecting pads (not shown in the figure) of the substrate 310 by the bonding wires 370. The protective encapsulant 330 is formed on the top surface 311 of the substrate 310 and encapsulates the sides 323 of the chip 320. The stiffening encapsulant 340 is in a strip and is formed inside the slot 313. The stiffening encapsulant 340 also contacts with the active surface 321 of the chip 320 and protrudes from the bottom surface 312 of the substrate 310. The external terminals 350 are disposed on the bottom surface 312 of the substrate 310. Furthermore, the Young's modulus of the stiffening encapsulant 340 is greater than the one of the protective encapsulant 330 and also the curing shrinkage of the stiffening encapsulant 340 is smaller than the one of the protective encapsulant 330. However, the protective encapsulant 330 is not required to encapsulate the back surface 322 of the chip 320 according to different designs of IC packages. The protruded height of the stiffening encapsulant 340 can not exceed the height of the external terminals 350, i.e., not smaller than the thickness of the substrate 310. With the cross section of "I", the warpage resistance of the stiffening encapsulant 340 can be greatly enhanced.

The protective encapsulant 330 and the stiffening encapsulant 340 are formed by MAP (Mold Array Package) BGA processes, i.e., the top molding gate and the bottom molding gate are located outside the substrate. Therefore, the protective encapsulant 330 or the stiffening encapsulants 340 of the adjacent IC packages 300 are connected to each other before package saw. Moreover, there is no molding gates left on the substrate after package saw.

Figure 11:
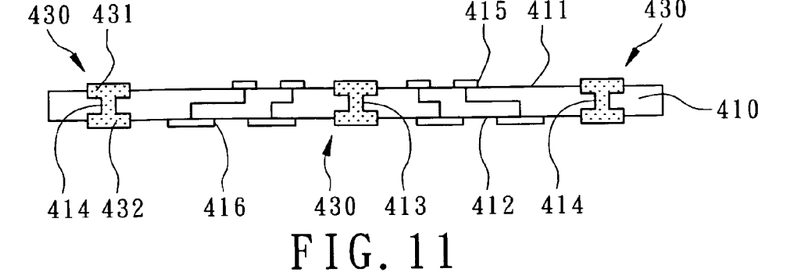
FIG. 11 shows a cross sectional view of an anti-warpage chip carrier of an IC package according to the third embodiment of the present invention.
Figure 12:
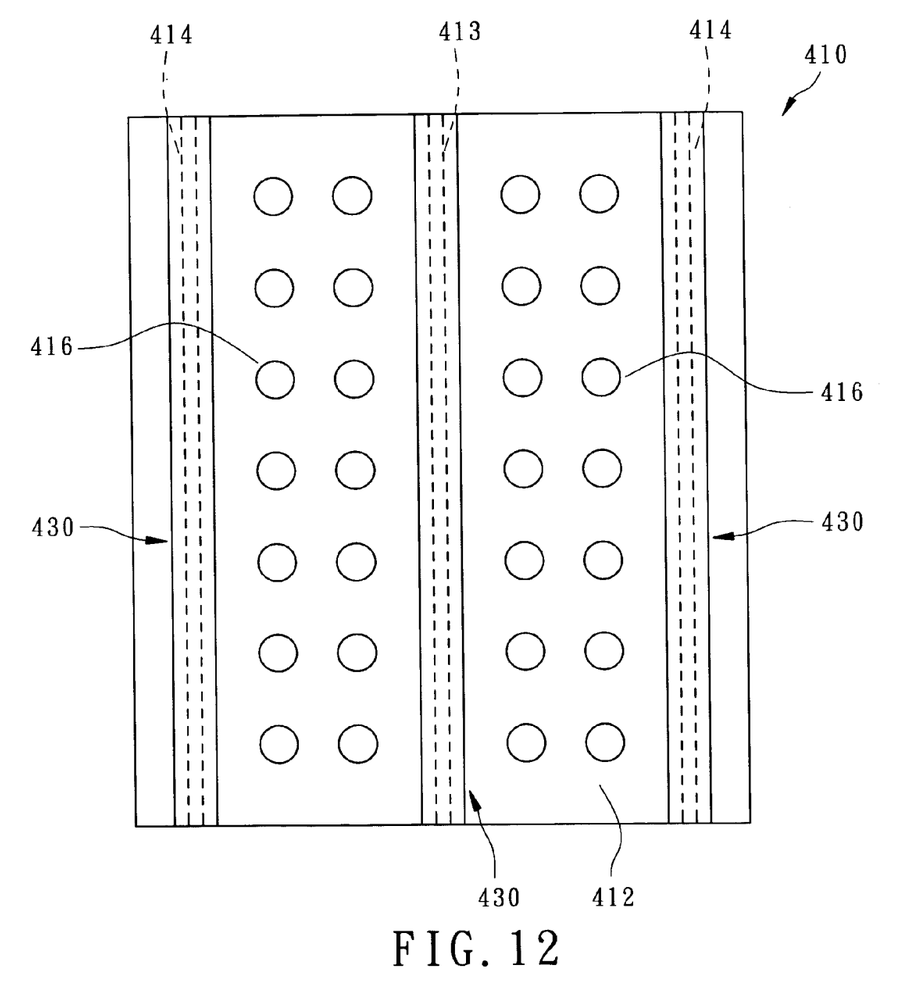
FIG. 12 shows a bottom view of the anti-warpage chip carrier according to the third embodiment of the present invention.

According to the third embodiment of the present invention, an anti-warpage chip carrier for an IC package is revealed, as shown in FIGS. 11 and 12. Before assembly, an anti-warpage chip carrier includes a substrate 410 and at least a rigid stiffener 430 where the substrate 410 has a top surface 411, a bottom surface 412, and at least a slot 413, 414. In the present embodiment, the slot 413 is formed at the center of the substrate 410 and two slots 414 are formed at the edges of the substrate 410. A plurality of bumping pads 415 are formed on the top surface 411 of the substrate 410 and a plurality of ball pads 416 are formed on the bottom surface 412 of the substrate 410 where the bumping pads 415 are electrically connected to the ball pads 416 by internal circuits. In the present embodiment, the substrate 410 is flexible.

The rigid stiffeners 430 are in a strip and is embedded in the slots 413, 414. The Young's modulus of the rigid stiffener 430 is between 20 GPa and 50 GPa. The material of the rigid stiffener 430 can be the same or different as the stiffening encapsulant as mentioned above. The curing shrinkage of the rigid stiffener 430 is between 0.01% and 0.1%. Each rigid stiffener 430 has a filling portion 431 and at least a flange portion 432 where the filling portion 431 is narrower than the flange portion 432 and is embedded in the corresponding slot 413 or 414. Moreover, the flange portion 432 is exposed from the bottom surface 412 of the substrate 410. In the present embodiment, each rigid stiffener 430 has a cross section of "I" and is embedded in the substrate 410. Normally, the thickness of the rigid stiffener 430 is not smaller than the one of the substrate 410 and the Young's modulus of the rigid stiffener 430 is greater than the one of the substrate 410. A long central axis is defined on the substrate 410 where the rigid stiffener 430 embedded at the central slot 413 is aligned to the long central axis. As shown in FIG. 12, the rigid stiffeners 430 at the edge slots 414 are parallel to the long central axis. Therefore, all of the stiffeners 430 are parallel to longer sides of the substrate 410. The warpage resistance along the long axis of the substrate 410 has been enhanced by the rigid stiffeners 430.

Figure 13:
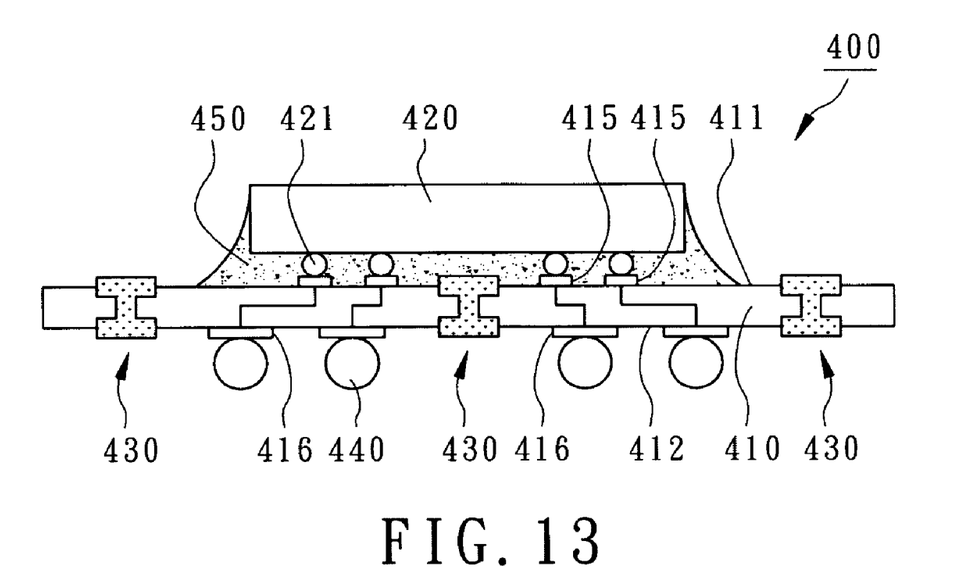
FIG. 13 shows a cross sectional view of an IC package utilizing the chip carrier according to the third embodiment of the present invention.

As shown in FIG. 13, the anti-warpage chip carrier can be implemented in a flip-chip type IC package 400 where a chip 420 is flip-chip attached to the top surface 411 of the substrate 410. A plurality of bumps 421 on the chip 420 are electrically connected to the bumping pads 415 of the substrate 410 by using reflow, thermal bonding, ultrasonic bonding, NCP bonding, or ACF bonding. The bumps 415 are encapsulated by an protective encapsulant 450 which can be chosen from a group of under-filling materials, NCP, or ACF. Moreover, the external terminals 440 such as solder balls are attached to the ball pads 416 of the substrate 410. Therefore, the rigid stiffeners 430 with higher Young's modulus with a cross section of "I" can greatly enhance the warpage resistance of the substrate 410 along the long central axis.

The above description of embodiments of this invention is intended to be illustrative and not limiting. Other embodiments of this invention will be obvious to those skilled in the art in view of the above disclosure.

What is claimed is:

1. An IC package comprising:

a substrate having a top surface, a bottom surface and at least a slot;

a chip disposed on the top surface of the substrate and having an active surface partially exposed from the slot;

a protective encapsulant formed on the top surface of the substrate and at least encapsulating the sides of the chip;

at least a stiffening encapsulant having a Young's modulus greater than the one of the protective encapsulant and having a curing shrinkage smaller than the one of the protective encapsulant, wherein the stiffening encapsulant is in a strip and is formed inside the slot to contact with the exposed active surface of the chip and protrudes from the bottom surface of the substrate; and a plurality of external terminals disposed on the bottom surface of the substrate, wherein the substrate has a plurality of top molding gates on the top surface and a bottom molding gate on the bottom surface, wherein the bottom molding gate is not aligned with the top molding gates.

2. The IC package of claim 1, wherein the stiffening encapsulant has a cross section of a reverse "T".

3. The IC package of claim 1, wherein the Young's modulus of the stiffening encapsulant is between 20 GPa and 50 GPa and the curing shrinkage of the stiffening encapsulant is between 0.01% and 0.1%.

4. The IC package of claim 1, wherein a long central axis is defined on the substrate, wherein the slot is formed on the long central axis and is shorter than one of sides of the chip parallel to the long central axis.

5. The IC package of claim 1, wherein the area of the active surface of the chip is not less than 70% of the one of the top surface of the substrate so that the IC package is a Chip Scale Package (CSP).

6. The IC package of claim 1, wherein the top molding gates are symmetrically disposed on both sides of the bottom molding gate.

7. The IC package of claim 1, further comprising a plurality of bonding wires passing through the slot to electrically connect the chip to the substrate and encapsulated by the stiffening encapsulant.

* * * * *